(12) United States Patent
Lee et al.

(10) Patent No.: US 11,489,113 B2
(45) Date of Patent: Nov. 1, 2022

(54) SEMICONDUCTOR DEVICE, MEMORY CELL AND METHOD OF FORMING THE SAME

(71) Applicant: Taiwan Semiconductor Manufacturing Co., Ltd., Hsinchu (TW)

(72) Inventors: Tung-Ying Lee, Hsinchu (TW); Shao-Ming Yu, Hsinchu County (TW); Yu-Chao Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/851,106

(22) Filed: Apr. 17, 2020

(65) Prior Publication Data

US 2021/0328139 A1    Oct. 21, 2021

(51) Int. Cl.
*H01L 45/00* (2006.01)

(52) U.S. Cl.
CPC .......... *H01L 45/1233* (2013.01); *H01L 45/06* (2013.01); *H01L 45/144* (2013.01); *H01L 45/1608* (2013.01)

(58) Field of Classification Search
CPC ....................................................... H01L 45/06
See application file for complete search history.

(56) References Cited

U.S. PATENT DOCUMENTS

| 7,473,597 B2 * | 1/2009 | Lee ................. H01L 45/144 438/253 |
| 11,302,865 B2 * | 4/2022 | Wu ................. H01L 27/2436 |
| 2009/0035514 A1 * | 2/2009 | Kang ................. H01L 45/12 428/131 |
| 2015/0187842 A1 * | 7/2015 | Cho ................. H01L 27/2463 257/4 |
| 2020/0144496 A1 * | 5/2020 | Glassman ............ H01L 45/08 |
| 2021/0313397 A1 * | 10/2021 | Lee ................. H01L 45/1253 |

* cited by examiner

*Primary Examiner* — Mounir S Amer
(74) *Attorney, Agent, or Firm* — JCIPRNET

(57) ABSTRACT

A memory cell includes a storage element layer, a bottom electrode, a top electrode and a liner layer. The storage element layer has a first surface and a concaved second surface opposite to the first surface. The bottom electrode is disposed on the first surface and connected to the storage element layer. The top electrode is on the concaved second surface and connected to the storage element layer. The liner layer is surrounding the storage element layer and the top electrode.

20 Claims, 7 Drawing Sheets

SEMICONDUCTOR DEVICE, MEMORY CELL AND METHOD OF FORMING THE SAME

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a PCM is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
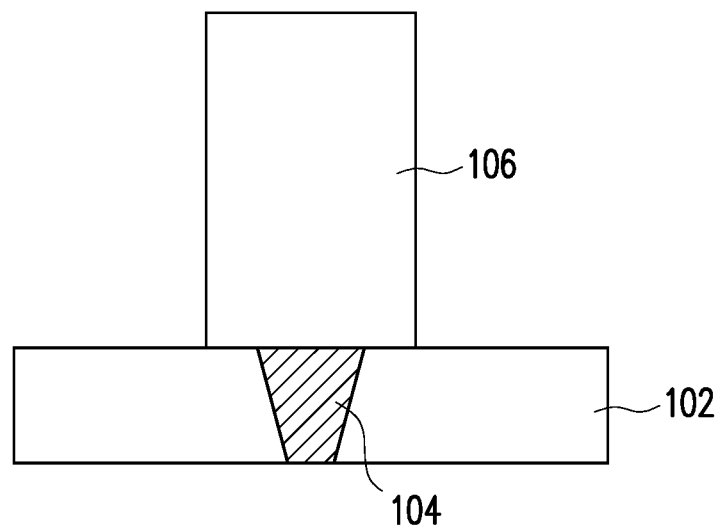
FIG. 1 to FIG. 10 are cross-sectional views of a method of forming a memory cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In conventional methods of forming a memory cell, when a storage element material is patterned by an etching process, the property of the formed storage element layer is undesirably changed due to the process variation. For example, the etched storage element layer has different atomic ratios at the center portion and the peripheral portion, some undesired etching residues may remain on the sidewalls of the etched storage element layer, or the sidewall of the etched storage element layer is uneven and damaged. In other words, the property of the storage element layer is not easily maintained to be consistent with the original design. Furthermore, since the storage element material is generally opaque, a misalignment and overlay shift issue may exist during the photolithography processes to define the storage element layer. In accordance with some embodiments discussed herein, the storage element layer and the top electrode are formed in separate steps after forming the liner layer and the surrounding dielectric layer. As such, the storage element layer and the top electrode may be formed by a self-aligned process, and the etching damage and overlay shift issues may be resolved.

FIG. 1 to FIG. 10 are cross-sectional views of a method of forming a memory cell in accordance with some embodiments of the present disclosure. The memory cell illustrated in the following embodiments may be applied to, but not limited thereto, a phase change random access memory (PCRAM) cell, hereinafter referred to as a PCM cell.

Referring to FIG. 1, a first dielectric layer 102 having a bottom electrode 104 embedded therein is provided. In some embodiments, the first dielectric layer 102 includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The first dielectric layer 102 may be formed by any suitable method, such as chemical vapor deposition (CVD), or the like.

In some embodiments, the bottom electrode 104 is formed by a single damascene process. For example, an opening is formed in the first dielectric layer 102, and the opening is filled with a conductive material. In a subsequent step, a planarization process (e.g., a chemical-mechanical planarization (CMP) process) is performed to remove excessive conductive material, thereby forming the bottom electrode 104. In some embodiments, the bottom electrode 104 includes a conductive material, such as Ti, Co, Cu, AlCu, W, TiN, TiW, TiAl, TiAlN, Ru, $RuO_x$, or a combination thereof. In some alternative embodiments, the bottom electrode 104 is referred to as a heater that is electrically coupled to the overlying structures (e.g. coupled to a storage element layer formed in subsequent steps). The heater is configured to generate heat in proportion to a current applied across the heater. In the case, the heater may be made of titanium nitride (TiN), titanium carbide (TiC), tungsten nitride (WN), some other high resistance material, Ru, $RuO_x$, or a combination thereof. In addition, the heater may have a round, square, or rectangular profile in a top view.

In some embodiments, a dummy structure 106 is formed on the bottom electrode 104 over the first dielectric layer 102. For example, the dummy structure 106 covers and contacts the bottom electrode 104. In one embodiment, the dummy structure 106 is a polysilicon layer. However, the disclosure is not limited thereto. A material of the dummy structure 106 is not particularly limited, as long as the dummy structure 106 may be easily removed to reveal the bottom electrode 104 in subsequent steps. In some embodiments, a profile of the dummy structure 106 corresponds to a profile of a storage element layer and a top electrode in the memory cell 10 (see FIG. 10).

Figure 2:
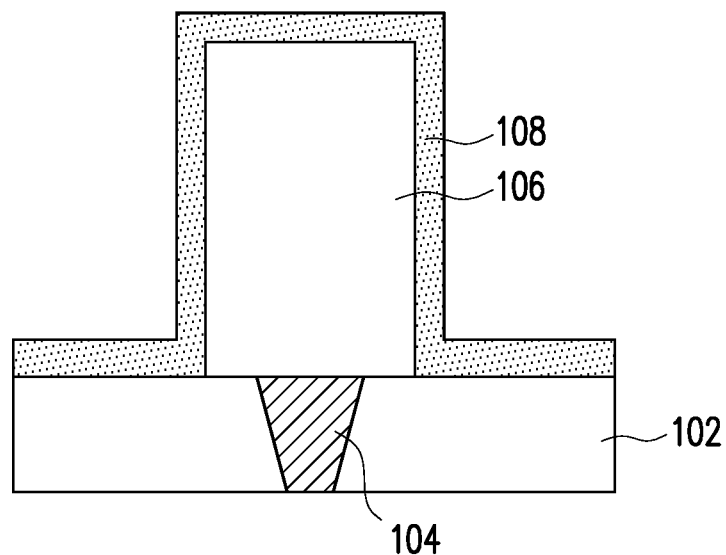

Referring to FIG. 2, after forming the dummy structure 106, a liner layer 108 is conformally formed over the first dielectric layer 102 and the dummy structure 106. For example, the dummy structure 106 covers a top surface of the first dielectric layer 102, and further cover sides and tops of the dummy structure 106. In some embodiments, the liner layer 108 includes a dielectric material such as silicon oxide, silicon nitride, and/or other suitable dielectric materials. Furthermore, the liner layer 108 may be formed by a suitable process such as atomic layer deposition (ALD), chemical vapor deposition (CVD), physical vapor deposition (PVD), or the like.

Figure 3:
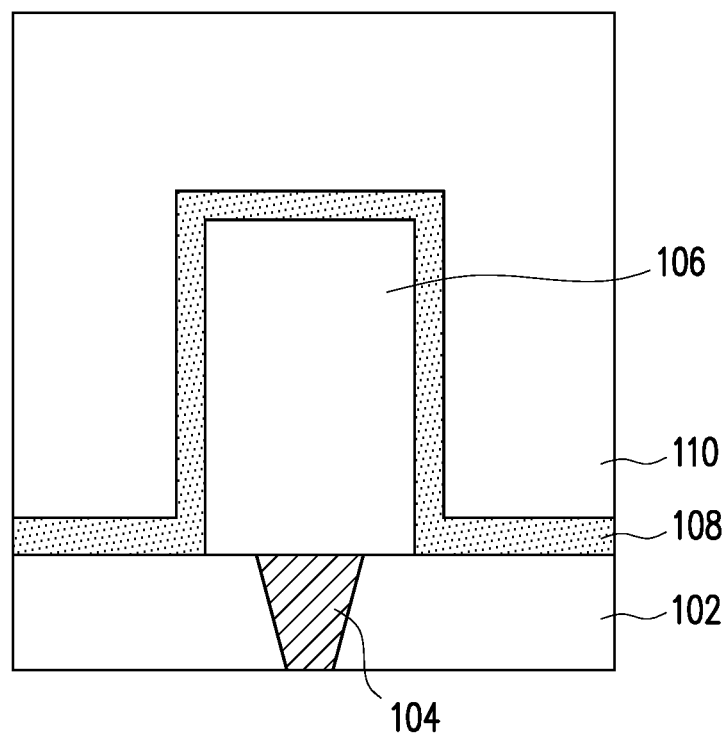

Referring to FIG. 3, after forming the liner layer 108, a second dielectric layer 110 is formed on the first dielectric layer 102. For example, in some embodiments, the second dielectric layer 110 is formed on the first dielectric layer 102 to surround the dummy structure 106 and the liner layer 108. In certain embodiments, the second dielectric layer 110 is separated from the first dielectric layer 102 by the liner layer 108. In some embodiments, the second dielectric layer 110 is referred to as an inter-metal dielectric (IMD) layer which includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The second dielectric layer 110 may be formed by any suitable method, such as chemical vapor deposition (CVD), or the like.

Figure 4:
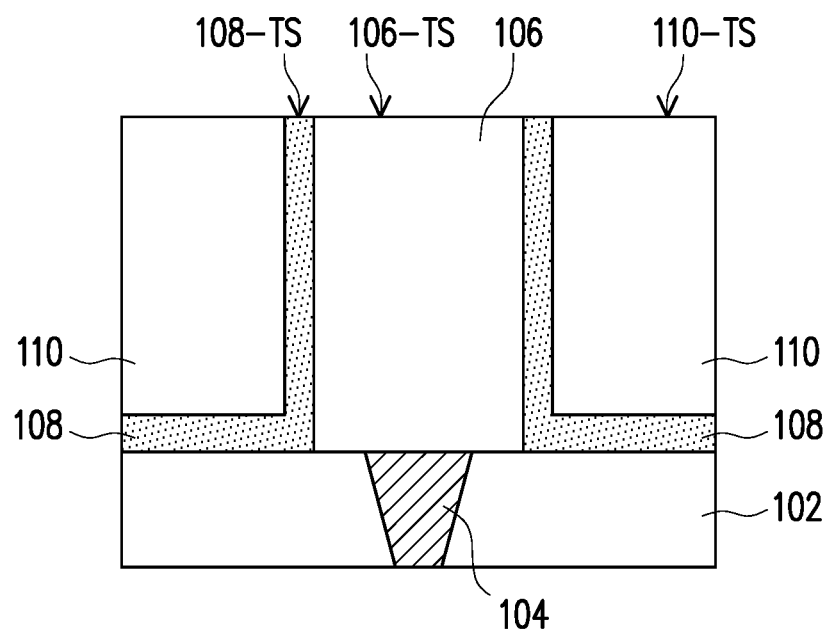

Referring to FIG. 4, after forming the second dielectric layer 110, a planarization step (e.g., a CMP process) may be performed to remove portions of the second dielectric layer 110 and portions of the liner layer 108. In some embodiments, portions of the liner layer 108 are removed along with portions of the second dielectric layer 110 so that a top surface 110-TS of the second dielectric layer 110 is aligned with a top surface 108-TS of the liner layer 108. In some embodiments, the dummy structure 106 is also partially removed. For example, a top surface 106-TS of the dummy structure 106 is aligned or coplanar with the top surface 108-TS of the liner layer 108 and the top surface 110-TS of the second dielectric layer 110 after the planarization step.

Figure 5:
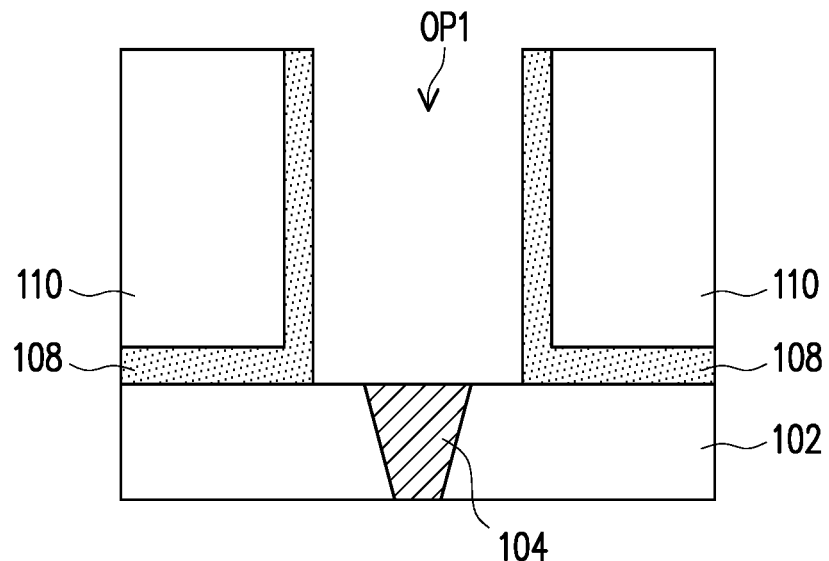

Referring to FIG. 5, in a subsequent step, the dummy structure 106 is removed to form an opening OP1 that reveals the bottom electrode 104. For example, the dummy structure 106 is completely removed to a top surface of the bottom electrode and portions of the first dielectric layer 102.

Figure 6:
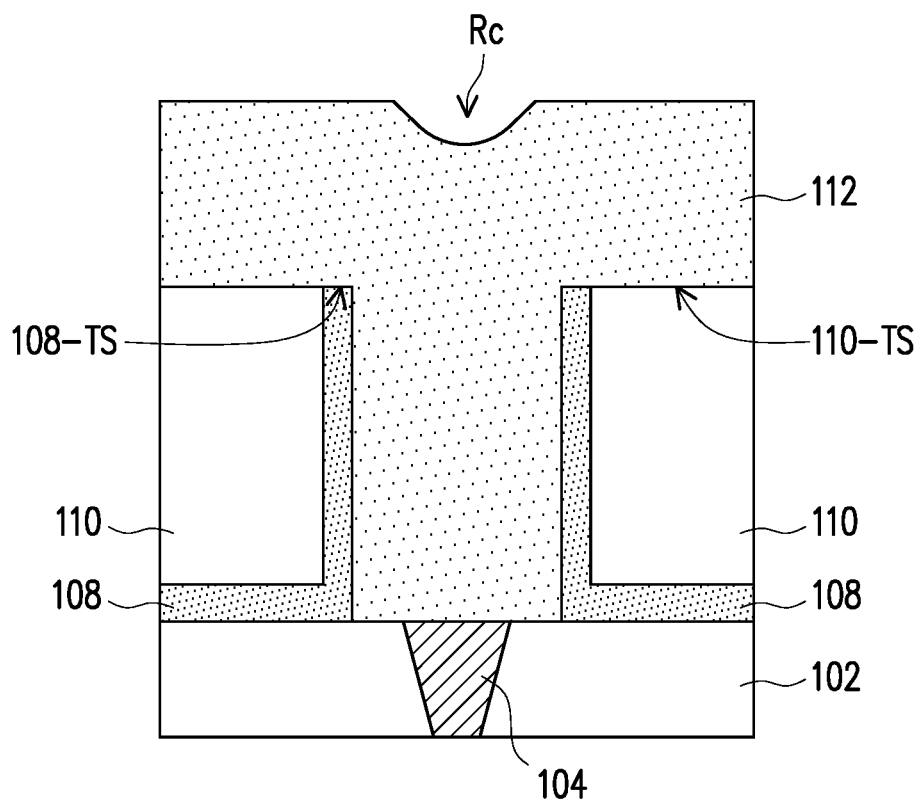

Referring to FIG. 6, in some embodiments, a storage element material 112 is formed into the opening OP1 and over the second dielectric layer 110 and the liner layer 108. For example, the storage element material 112 covers the top surface 110-TS of the second dielectric layer 110 and the top surface 108-TS of the liner layer 108. In some embodiments, the storage element material 112 includes a recessed portion Rc, wherein the recessed portion Rc overlaps with a position of the bottom electrode 104.

In some embodiments, the storage element material 112 includes a phase change material when the memory cell 10 (FIG. 10) is a PCM cell. The phase change material may include a chalcogenide material, such as an indium(In)-antimony(Sb)-tellurium(Te) (IST) material or a germanium (Ge)-antimony(Sb)-tellurium(Te) (GST) material. The ISG material may include $In_2Sb_2Te_5$, $In_1Sb_2Te_4$, $In_1Sb_4Te_7$, or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other storage element materials include transition metal oxide materials or alloys including two or more metals, such as transition metals, alkaline earth metals, and/or rare earth metals.

The storage element material 112 may be formed by any suitable method, such as chemical vapor deposition (CVD), atomic layer deposition (ALD), or the like. Embodiments are not limited to a particular storage element material or materials associated with the storage elements of the PCM cell. In some alternative embodiments, the storage element material is used for a resistive random access memory (RRAM) cell, a magnetoresistive random access memory (MRAM) cell, a ferroelectric random access memory (FeRAM) cell, or a combination thereof. That is, the storage element material may include binary metal oxide materials, colossal magnetoresistive materials, and/or various polymer-based resistance variable materials, or the like.

Figure 7:
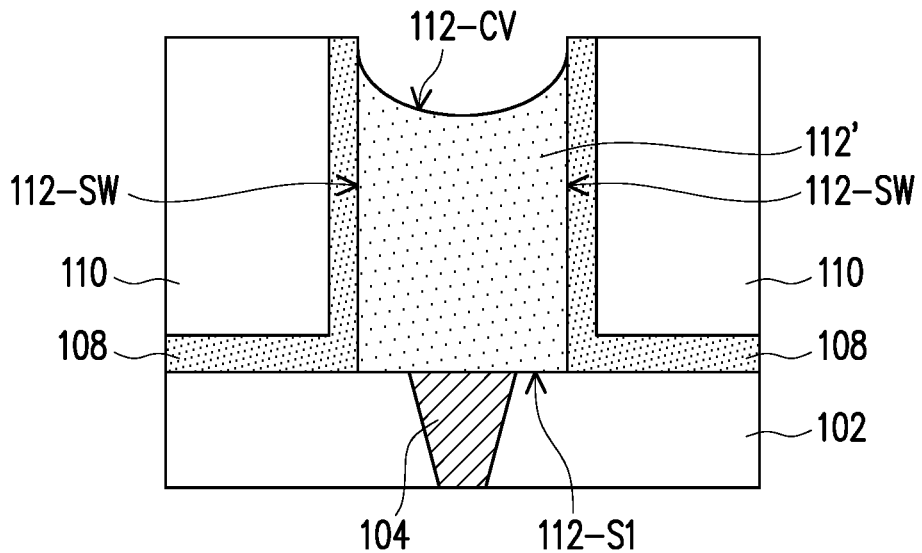

Referring to FIG. 7, in a next step, the storage element material 112 is etched to form a storage element layer 112' (or a phase change layer). The storage element material 112 may be etched by suitable wet etching or dry etching processes. The disclosure is not particularly limited thereto. In some embodiments, the storage element material 112 is etched to form the storage element layer 112' by removing portions of the storage element material 112 located over the liner layer 108 and the second dielectric layer 110. After the etching process, the storage element layer 112' includes a first surface 112-S1 (a planar first surface), a concaved second surface 112-CV opposite to the first surface 112-S1, and side surfaces 112-SW joining the first surface 112-S1 to the concaved second surface 112-CV.

In some embodiments, the first surface 112-S1 of the storage element layer 112' is joined with (or connected to) the bottom electrode 104. In some embodiments, the storage element layer 112' is surrounded by the liner layer 108, whereby the side surfaces 112-SW contacts the liner layer 108. In some embodiments, the liner layer 108 is located in between the second dielectric layer 110 and the storage element layer 112'. In certain embodiments, the recessed portion Re of the storage element material 112 forms the concaved second surface 112-CV of the storage element layer 112'. Furthermore, the storage element material 112 is etched so that the concaved second surface 112-CV of the storage element layer 112' is located below the top surface 110-TS of the second dielectric layer, and below the top surface 108-TS of the liner layer 108 (see FIG. 6. to FIG. 7).

In the exemplary embodiment, since the storage element layer 112' is formed after the formation of the liner layer 108 and the second dielectric layer 110, the position of the storage element layer 112' is fixed, and the side surfaces 112-SW of the storage element layer 112' are further protected by the liner layer 108. As such, etching damage and overlay shift issues of the storage element layer 112' observed in conventional processes may be prevented.

Figure 8:
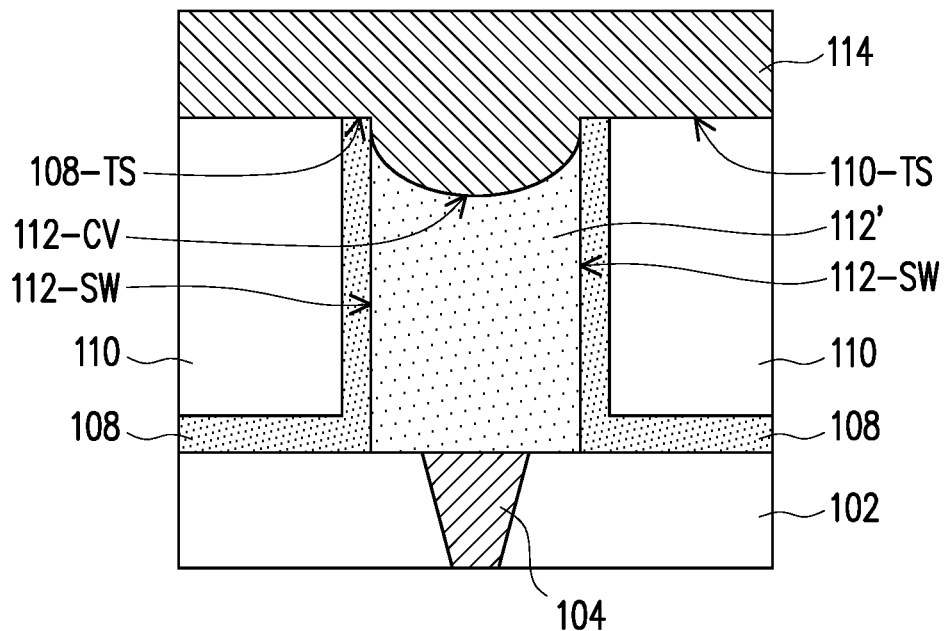

Referring to FIG. 8, after forming the storage element layer 112', a conductive material 114 is formed on the concaved second surface 112-CV of the storage element layer 112' and over the liner layer 108 and the second dielectric layer 110. For example, the conductive material 114 cover and contacts the top surface 108-TS of the liner layer 108 and the top surface 110-TS of the second dielectric layer 110. In some embodiments, the storage element layer 112' is located in between the conductive material 114 and the bottom electrode 104. In some embodiments, the conductive material 114 includes materials such as conductive material 114. In certain embodiments, the conductive material 114 and the bottom electrode 104 may have the same material or different materials. For example, in one embodiment, the conductive material 114 and the bottom electrode 104 are both made of TiN. In certain embodiments, the conductive material 114 may be formed by any suitable method, such as chemical vapor deposition (CVD), physical vapor deposition (PVD), or the like.

Figure 9:
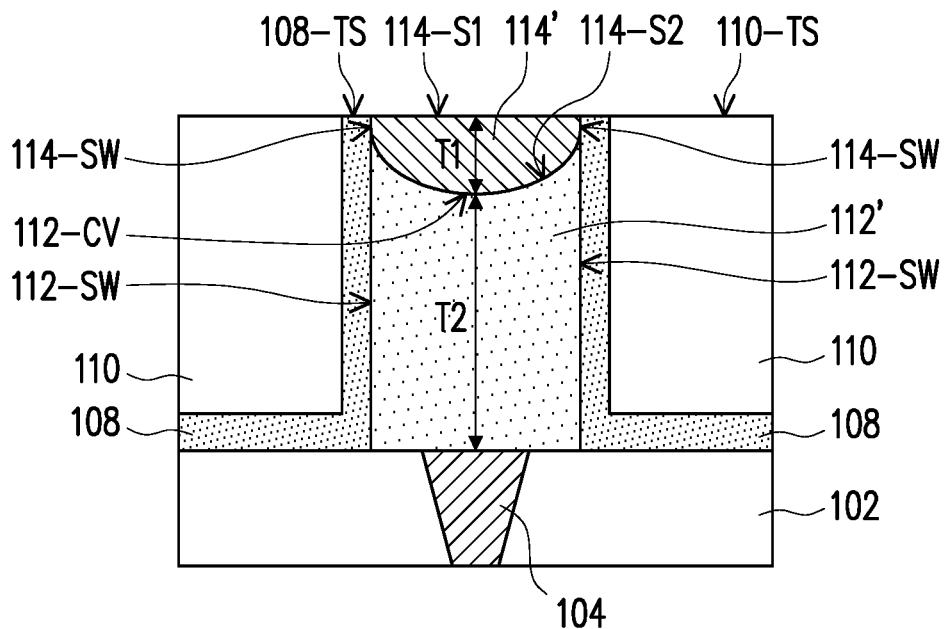

Referring to FIG. 9, in a next step, portions of the conductive material 114 are removed to form a top electrode 114'. For example, portions of the conductive material 114 may be removed by a planarization step (e.g., a CMP process) to form the top electrode 114'. After the planarization step, the top electrode 114' is formed with a planar first surface 114-S1, a curved second surface 114-S2 opposite to the planar first surface 114-S1, and side surfaces 114-SW joining the planar first surface 114-S1 to the curved second surface 114-S2.

As illustrated in FIG. 9, the top electrode 114' is disposed on the concaved second surface 112-CV and connected to the storage element layer 112'. In some embodiments, the curved second surface 114-S2 of the top electrode 114' is joined with the concaved second surface 112-CV of the storage element layer 112'. In some embodiments, the planar first surface 114-S1 of the top electrode 114' is aligned (or coplanar) with the top surface 108-TS of the liner layer 108 and the top surface 110-TS of the second dielectric layer 110. In some embodiments, side surfaces 112-SW of the storage element layer 112' (phase change layer) are aligned with the side surfaces 114-SW of the top electrode 114'. Furthermore, the storage element layer 112' and the top electrode 114' are surrounded by the liner layer 108 and the second dielectric layer 110, whereas the storage element layer 112' is located in between the top electrode 114' and the bottom electrode 104. In the exemplary embodiment, a maximum thickness T1 of the top electrode 114' is smaller than a minimum thickness T2 of the storage element layer 112'. In some embodiments, a ratio of the thickness T1 to the thickness T2 (T1:T2) is in a range of 1:10 to 1:3.

Figure 10:
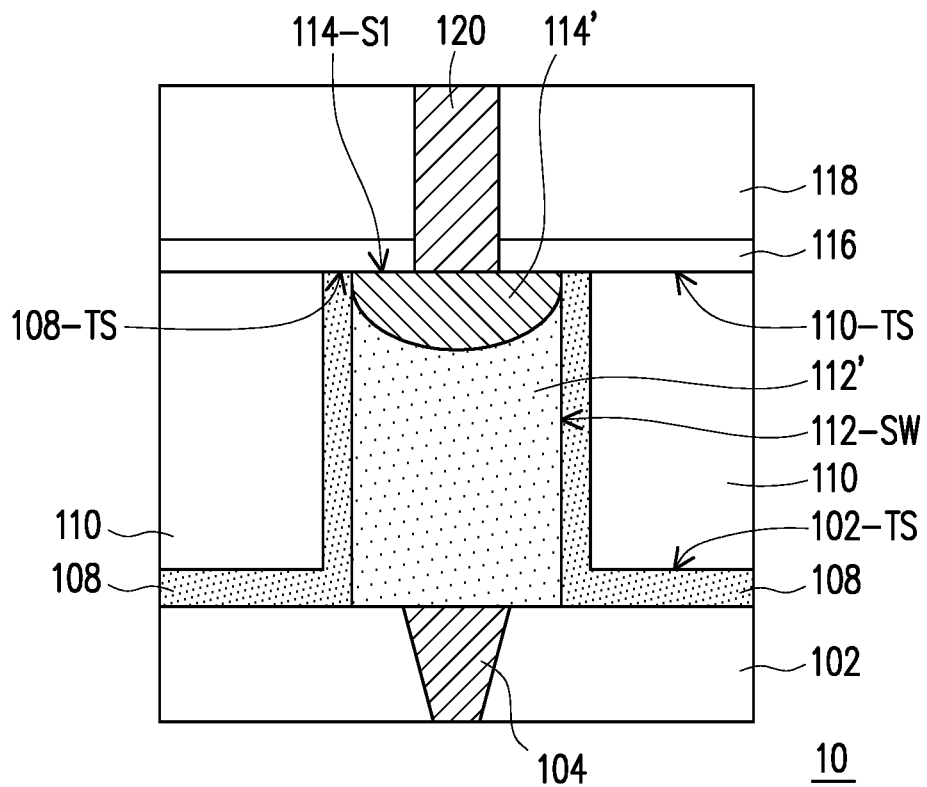

Referring to FIG. 10, after forming the top electrode 114', an etch-stop layer 116 and an insulating layer 118 are sequentially formed over the liner layer 108 and the second dielectric layer 110. The insulating layer 118 being located above the etch-stop layer 116, and the etch-stop layer is in contact with the top electrode 114', the liner layer 108 and the second dielectric layer 110. In some embodiments, the etch-stop layer 116 includes SiC, SiN, SiON, $HfO_x$, $ZrO_x$, $LaO_x$, or a combination thereof. The etch-stop layer 116 may be formed by any suitable method, such as chemical vapor deposition (CVD), or the like. In some embodiments, the insulating layer 118 may be made of a dielectric material, such as silicon oxide, silicon nitride, silicon oxynitride, a spin-on dielectric material, or a low-k dielectric material. The insulating layer 118 may be formed by any suitable method, such as chemical vapor deposition (CVD), or the like.

In some embodiments, portions of the insulating layer 118 and portions of the etch-stop layer 116 are removed to form a second opening (not shown) revealing the planar first surface 114-S1 of the top electrode 114'. In some embodiments, portions of the insulating layer 118 and portions of the etch-stop layer 116 are removed by etching processes. In certain embodiments, the etch-stop layer 116 is used to prevent the underlying layers from damage caused by the over-etching of the insulating layer 118. In a subsequent step, a conductive via 120 is formed in the second opening, wherein the conductive via 120 is electrically connected to the top electrode 114'. In some embodiments, the conductive via 120 is formed by a single damascene process. For example, after forming the second opening, a conductive material is formed to fill into the second opening. Thereafter, a planarization process (e.g., a CMP process) is performed to remove excessive conductive material, thereby forming the conductive via 120. In some embodiments, the conductive via 120 includes metals or metal alloys including one or more of Al, AlCu, Cu, Ti, TiN, W, or the like.

As shown in FIG. 10, a memory cell 10 is accomplished after forming the conductive via 120. In some embodiments, the memory cell 10 includes the bottom electrode 104, the top electrode 114', the storage element layer 112' located in between the bottom electrode 104 and the top electrode 114'. The memory cell 10 may further include the first dielectric layer 102 surrounding the bottom electrode 104, and the liner layer 108 and the second dielectric layer 110 surrounding the storage element layer 112' and the top electrode 114'.

In some embodiments, the storage element layer 112' includes a phase change material when the memory cell 10 is a PCM cell. When the storage element layer 112' is a phase change layer, the storage element layer 112' has a variable phase representing a data bit. For example, the storage element layer 112' (phase change layer) has a crystalline phase and an amorphous phase which are interchangeable. The crystalline phase and the amorphous phase may respectively represent a binary "1" and a binary "0", or vice versa. Accordingly, the storage element layer 112' (phase change layer) has a variable resistance that changes with the variable phase of the storage element layer 112' (phase change layer). For example, the storage element layer 112' (phase change layer) has a high resistance in the amorphous phase and a low resistance in the crystalline phase.

According to some embodiments, in the memory cell 10, the data state of the memory cell 10 is read by measuring the resistance of the memory cell 10 (i.e., the resistance from the bottom electrode 104 to the top electrode 114'). The phase of the storage element layer 112' represents the data state of the memory cell 10, the resistance of the storage element layer 112', or the resistance of the memory cell 10. Furthermore, the data state of the memory cell 10 may be set and reset by changing the phase of the storage element layer 112'.

In some embodiments, the phase of the storage element layer 112' is changed by heating. For example, the bottom electrode (or heater) 104 heats the storage element layer 112' to a first temperature that induces crystallization of the storage element layer 112', so as to change the storage element layer 112' to the crystalline phase (e.g., to set the memory cell 10). Similarly, the bottom electrode (or heater) 104 heats the storage element layer 112' to a second temperature that melts the storage element layer 112', so as to change the storage element layer 112' to the amorphous phase (e.g., to reset the memory cell 10). The first temperature is lower than the second temperature. In some embodiments, the first temperature is 100° C. to 200° C. and the second temperature is 500° C. to 800° C.

The amount of heat generated by the bottom electrode 104 varies in proportion to the current applied to the bottom electrode 104. That is, the storage element layer 112' is heated up to a temperature (i.e., the second temperature) higher than the melting temperature when a current passes through. The temperature is then quickly dropped below the crystallization temperature. In the case, a portion of the storage element layer 112' contacting the bottom electrode 104 is changed to the amorphous state with high resistivity, and thus the state of the storage element layer 112' is changed to a high resistance state. Then, the portion of the storage element layer 112' may be reset back to the crystalline state by heating up the storage element layer 112' to a temperature (i.e., the first temperature) higher than the crystallization temperature and lower than the melting temperature, for a certain period.

Based on the above, it is known that the storage element layer 112' is a key layer for operating the memory cell 10. In the present embodiment, the storage element layer 112' is formed after defining a position of the liner layer 108 and the second dielectric layer 110. As such, when forming the storage element layer 112' in a subsequent step, the position of the storage element layer 112' is fixed in an opening surrounded by the liner layer 108 and the second dielectric layer 110. Therefore, an overlay shift or misalignment issue of the storage element layer 112' may be resolved. Furthermore, since the storage element layer 112' is directly formed in the opening surrounded by the liner layer 108, the sidewalls 112-SW of the storage element layer 112' may be protected by the liner layer 108, to prevent the storage element layer 112' from etching damage.

Figure 11:
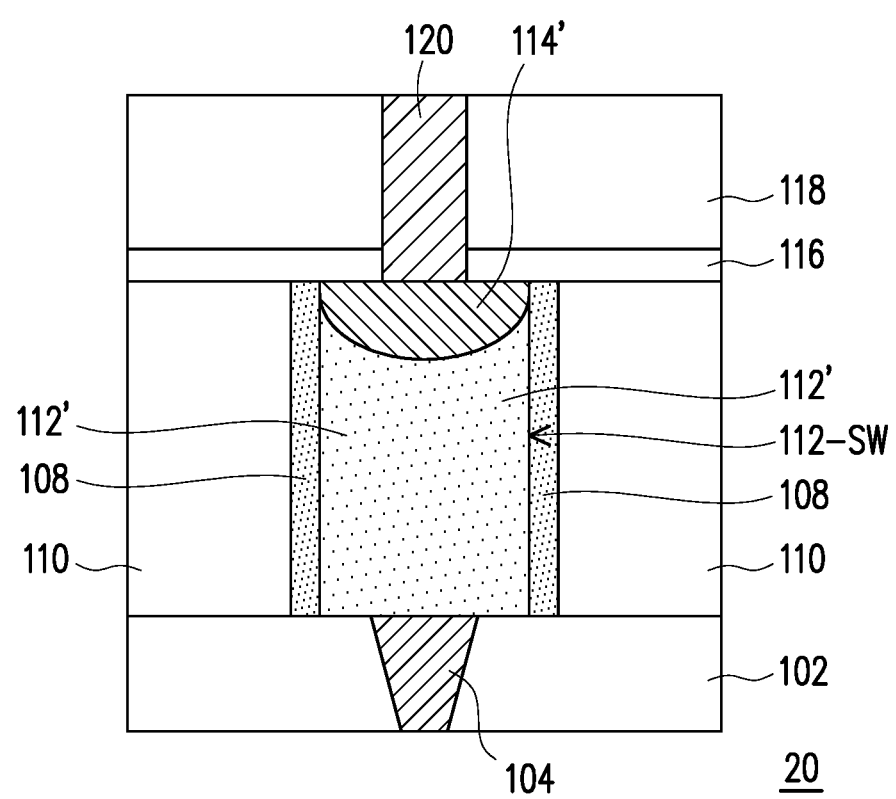
FIG. 11 is a cross-sectional view of a memory cell in accordance with some other embodiments of the present disclosure.

FIG. 11 is a cross-sectional view of a memory cell in accordance with some other embodiments of the present disclosure. The memory cell 20 illustrated in FIG. 11 is similar to the memory cell 10 illustrated in FIG. 10. Therefore, the same reference numerals are used to refer to the same or liked parts, and its detailed description will be omitted herein. In the memory cell 10 illustrated in FIG. 10, the liner layer 108 is disposed across a top surface 102-TS of the first dielectric layer 102 and on side surfaces 112-SW of the storage element layer 112'. However, the disclosure is not limited thereto. Referring to FIG. 11, in the memory cell 20, the liner layer 108 is covering side surfaces 112-SW of the storage element layer 112', whereby the second dielectric layer 110 surrounds the liner layer 108 and contacts the first dielectric layer 110. Furthermore, the liner layer 108 is sandwiched between the storage element layer 112' and the second dielectric layer 110.

Similarly, in the memory cell 20, the storage element layer 112' is formed after defining a position of the liner layer 108 and the second dielectric layer 110. As such, when forming the storage element layer 112' in a subsequent step, the position of the storage element layer 112' is fixed in an opening surrounded by the liner layer 108 and the second dielectric layer 110. Therefore, an overlay shift or misalignment issue of the storage element layer 112' may be resolved. Furthermore, since the storage element layer 112' is directly formed in the opening surrounded by the liner layer 108, the sidewalls 112-SW of the storage element layer 112' may be protected by the liner layer 108, to prevent the storage element layer 112' from etching damage.

Figure 12:
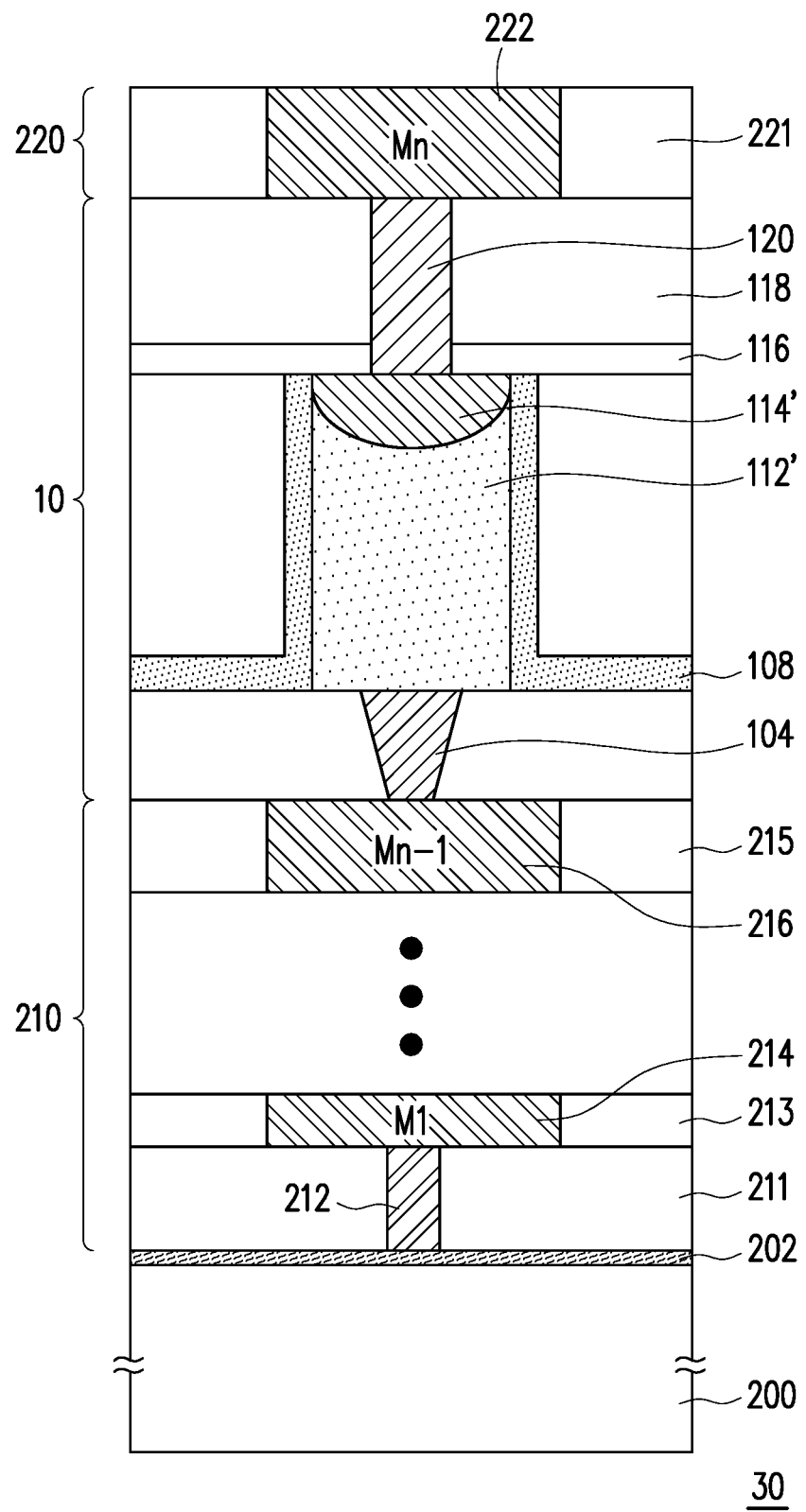
FIG. 12 is a cross-sectional view of a semiconductor device having a memory cell in accordance with some embodiments of the present disclosure.

FIG. 12 is a cross-sectional view of a semiconductor device having a memory cell in accordance with some embodiments of the present disclosure. Referring to FIG. 12, the semiconductor device 30 may include a substrate 200, a device region 202, a first interconnection structure 210, the memory cell 10, and a second interconnect structure 220. In some embodiments, the substrate 200 is a semiconductor substrate, such as a bulk semiconductor, a semiconductor-on-insulator (SOI) substrate, or the like. The substrate 200 may be doped (e.g., with a p-type or an n-type dopant) or undoped. The substrate 200 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 200 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 202 is disposed on the substrate 200 in a front-end-of-line (FEOL) process. The device region 202 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 202 includes a gate structure, source and drain regions, and isolation structures such as shallow trench isolation (STI) structures (not shown). In the device region 202, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 200. The functions of the devices may include memory, processors, sensors, amplifiers, power distribution, input/output circuitry, or the like.

As illustrated in FIG. 12, the first interconnect structure 210 is disposed on the device region 202, and the device region 202 is disposed between the substrate 200 and the first interconnect structure 210. In some embodiments, the first interconnect structure 210 includes insulating layers 211, 213, 215, a conductive via 212, and conductive layers 214, 216. The insulating layers 211, 213, 215 are collectively referred to as an inter-metal dielectric (IMD) layer, which may be made of a dielectric material, such as silicon oxide, silicon nitride, silicon oxynitride, a spin-on dielectric material, or a low-k dielectric material. The conductive via 212 is disposed in the insulating layer 211 and electrically connected to the device region 202. The conductive layer 214 is disposed in the insulating layer 213 and disposed on the conductive via 212. The conductive layer 214 is electrically connected to the device region 202 by the conductive via 212. The conductive layer 216 is disposed in the insulating layer 215 and is electrically connected to the bottom electrode 104 of the memory cell 10. The conductive layers 214, 216 may be conductive lines and may include commonly used conductive materials, such as metals or metal alloys including one or more of Al, AlCu, Cu, Ti, TiN, W, and the like. In some embodiments, the conductive layer 216 forms a portion of a current driving circuit (not shown) to provide current to the memory cell 10.

In some embodiments, the memory cell 10 and the second interconnect structure 220 are stacked on the first interconnect structure 210 in order. The memory cell 10 is similar to that shown in FIG. 1 to FIG. 10, thus its detailed description will not be repeated herein. The memory cell 10 is disposed between and electrically connected to the first interconnect structure 210 and the second interconnect structure 220. For example, the bottom electrode 104 is in contact and electrically connected to the conductive layer 216, whereas the top electrode 114' is in contact and electrically connected to the conductive via 120. The conductive layer 216 and the conductive via 120 may provide the current to conduct the storage element layer 112'. Although only the memory cell 10 is illustrated in FIG. 12, the embodiments of the present disclosure are not limited thereto. In other embodiments, the memory cell 20 is used to replace the memory cell 10.

The second interconnect structure 220 may include an insulating layer 221 and a conductive layer 222. The insulating layer 221 is disposed on the memory cell 10 above the insulating layer 118. The conductive layer 222 is disposed on the insulating layer 118, and is in contact with and electrically connected to the conductive via 120. In some embodiments, the insulating layer 221 is referred as an inter-metal dielectric (IMD) layer, which may be made of a dielectric material, such as silicon oxide, silicon nitride, silicon oxynitride, a spin-on dielectric material, or a low-k dielectric material. The conductive layer 222 may be a conductive line, which may include metals or metal alloys including one or more of Al, AlCu, Cu, Ti, TiN, W, or the like. The conductive layer 222 is a portion of a current driving circuit (not shown) to provide current to the memory cell 10. In some embodiments, the conductive via 120 and the conductive layer 222 are formed by a dual damascene process. That is, the conductive via 120 and the conductive layer 222 may be formed simultaneously.

In some embodiments, the conductive layer 214 is referred to as the metal 1 (M1), the conductive layer 216 is referred to as the metal n−1 (Mn−1), and the conductive layer 222 is referred to as the metal n (Mn). The memory cell 10 may be disposed between the Mn and the Mn−1 layers. That is, the memory cell 10 may be disposed between any two adjacent conductive layers in the back-end-of-line (BEOL) structure. For example, the memory cell 10 is disposed between the M2 and the M3, between the M3 and the M4, and so on. Therefore, the fabricating process of the memory cell may be compatible with the BEOL process of the semiconductor device, thereby simplifying process steps and efficiently improving the integration density. In some alternative embodiments, the memory cell 10 is at the same level with the Mn−1. In addition, one or more conductive layers may be further disposed between the M1 and the Mn−1.

In the above-mentioned embodiments, the storage element layer is formed after defining a position of a liner layer and a dielectric layer (e.g. second dielectric layer). As such, when forming the storage element layer in a subsequent step, the position of the storage element layer is fixed in an opening surrounded by the liner layer and the second dielectric layer. Therefore, an overlay shift or misalignment issue of the storage element layer may be resolved. Furthermore, since the storage element layer is directly formed in the opening surrounded by the liner layer, the sidewalls of the storage element layer may be protected by the liner layer, to prevent the storage element layer from etching damage. In other words, the storage element layer and the top electrode may be formed by a self-aligned process, and the etching damage and overlay shift issues seen in conventional processes may be resolved.

In accordance with some embodiments of the present disclosure, a memory cell includes a storage element layer, a bottom electrode, a top electrode and a liner layer. The storage element layer has a first surface and a concaved second surface opposite to the first surface. The bottom electrode is disposed on the first surface and connected to the storage element layer. The top electrode is on the concaved second surface and connected to the storage element layer. The liner layer is surrounding the storage element layer and the top electrode.

In accordance with some other embodiments of the present disclosure, a semiconductor device includes a first interconnect structure, a memory cell and a second interconnect structure. The first interconnect structure is disposed on a substrate. The memory cell is disposed on the first interconnect structure. The memory cell includes a bottom electrode, a top electrode, a phase change layer and a dielectric layer. The bottom electrode is electrically connected to the first interconnect structure. The top electrode is disposed over the bottom electrode, wherein the top electrode has a planar first surface, a curved second surface opposite to the planar first surface and side surfaces joining the planar first surface to the curved second surface. The phase change layer is disposed between the bottom electrode and the top electrode. The dielectric layer is surrounding the phase change layer and the top electrode. The second interconnect structure is disposed on the memory cell and electrically connected to the top electrode.

In accordance with yet another embodiment of the present disclosure, a method of forming a memory cell is described. The method includes the following steps. A first dielectric layer is provided, the first dielectric layer has a bottom embedded therein. A dummy structure is formed over the bottom electrode. A liner layer is formed to conformally cover the first dielectric layer and the dummy structure. Portions of the liner layer are removed to reveal a top surface of the dummy structure. The dummy structure is removed to form an opening revealing the bottom electrode. A storage element material is formed in the opening, and the storage element material is etched to form a storage element layer, wherein the storage element layer has a first surface and a concaved second surface opposite to the first surface, and the first surface is joined with the bottom electrode. A top electrode is formed on the concaved second surface of the storage element layer, wherein the top electrode is connected to the storage element layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory cell, comprising:
a storage element layer having a first surface and a concaved second surface opposite to the first surface;
a bottom electrode disposed on the first surface and connected to the storage element layer;
a top electrode disposed on the concaved second surface and connected to the storage element layer, wherein the top electrode has a top surface, a bottom surface opposite to the top surface, and side surfaces joining the top surface to the bottom surface, and the bottom surface is contacting the concaved second surface of the storage element layer; and a liner layer surrounding the storage element layer and the top electrode, wherein the top surface of the top electrode is aligned with a top surface of the liner layer, and side surfaces of the top electrode are facing and contacting the liner layer.

2. The memory cell according to claim 1, further comprising:

a first dielectric layer, wherein the bottom electrode is embedded in the first dielectric layer, and the liner layer is disposed across a top surface of the first dielectric layer and on side surfaces of the storage element layer.

3. The memory cell according to claim 2, further comprising a second dielectric layer disposed over the first dielectric layer, wherein the liner layer is located in between the second dielectric layer and the storage element layer.

4. The memory cell according to claim 3, wherein the top surface of the top electrode is further aligned with a top surface of the second dielectric layer.

5. The memory cell according to claim 1, wherein the bottom surface of the top electrode is a curved surface.

6. The memory cell according to claim 1, further comprising an etch-stop layer disposed on the top electrode and the liner layer, and in contact with the top electrode and the liner layer.

7. The memory cell according to claim 6, further comprising:

a conductive via disposed on and electrically connected to the top electrode; and an insulating layer disposed on the etch-stop layer and surrounding the conductive via.

8. The memory cell according to claim 1, wherein a material of the storage element layer comprises a phase change material, and the phase change material comprises a germanium(Ge)-antimony(Sb)-tellurium(Te) (GST) material or an indium(In)-antimony(Sb)-tellurium(Te) (IST) material.

9. A semiconductor device, comprising:

a first interconnect structure, disposed on a substrate;

a memory cell, disposed on the first interconnect structure, wherein the memory cell comprises:

a bottom electrode electrically connected to the first interconnect structure;

a top electrode disposed over the bottom electrode, wherein the top electrode has a planar first surface, a curved second surface opposite to the planar first surface and side surfaces joining the planar first surface to the curved second surface;

a phase change layer disposed between the bottom electrode and the top electrode, wherein side surfaces of the phase change layer are aligned with the side surfaces of the top electrode; and a dielectric layer surrounding the phase change layer and the top electrode; and a second interconnect structure, disposed on the memory cell and electrically connected to the top electrode.

10. The semiconductor device according to claim 9, further comprising a liner layer separating the dielectric layer from the phase change layer.

11. The semiconductor device according to claim 10, wherein the planar first surface of the top electrode is aligned with a top surface of the liner layer and a top surface of the dielectric layer.

12. The semiconductor device according to claim 9, wherein the phase change layer has a concaved surface, and the concaved surface is joined with the curved second surface of the top electrode.

13. The semiconductor device according to claim 9, further comprising an etch-stop layer covering the planar first surface of the top electrode and covering a top surface of the dielectric layer.

14. The semiconductor device according to claim 9, further comprising a second interconnect structure disposed on the memory cell, wherein the second interconnect structure is electrically connected to the top electrode.

15. A method of forming a memory cell, comprising:

providing a first dielectric layer having a bottom electrode embedded therein;

forming a dummy structure over the bottom electrode;

forming a liner layer conformally covering the first dielectric layer and the dummy structure;

removing portions of the liner layer to reveal a top surface of the dummy structure;

removing the dummy structure to form an opening revealing the bottom electrode;

forming a storage element material in the opening and etching the storage element material to form a storage element layer, wherein the storage element layer has a first surface and a concaved second surface opposite to the first surface, and the first surface is joined with the bottom electrode; and forming a top electrode on the concaved second surface of the storage element layer, wherein the top electrode is connected to the storage element layer, the top electrode has a top surface, a bottom surface opposite to the top surface, and side surfaces joining the top surface to the bottom surface, and the bottom surface is contacting the concaved second surface of the storage element layer, and wherein the liner layer is surrounding the storage element layer and the top electrode, and the top surface of the top electrode is aligned with a top surface of the liner layer, and side surfaces of the top electrode are facing and contacting the liner layer.

16. The method according to claim 15, wherein forming the top electrode comprises:

forming a conductive material on the concaved second surface of the storage element layer and over the liner layer; and removing portions of the conductive material to form the top electrode so that the top surface of the top electrode is aligned with the top surface of the liner layer.

17. The method according to claim 15, further comprising:

forming a second dielectric layer on the first dielectric layer, wherein the second dielectric layer is surrounding the dummy structure and the liner layer; and removing the portions of the liner layer along with portions of the second dielectric layer so that a top surface of the second dielectric layer is aligned with the top surface of the liner layer.

18. The method according to claim 15, further comprising:

forming an etch-stop layer on the top electrode and the liner layer, wherein the etch-stop layer is in contact with the top electrode and the liner layer.

19. The method according to claim 15, further comprising:
- forming an insulating layer over the etch-stop layer;
- removing portions of the insulating layer and portions of the etch-stop layer to form a second opening revealing the top electrode; and
- forming a conductive via in the second opening, wherein the conductive via is electrically connected to the top electrode.

20. The method according to claim 15, wherein forming the storage element layer comprises:
- forming the storage element material into the opening and over the liner layer, wherein the storage element material includes a recessed portion; and
- etching the storage element material to form the storage element layer by removing portions of the storage element material located over the liner layer, and wherein the recessed portion forms the concaved second surface of the storage element layer.

\* \* \* \* \*